United States Patent [19]
Tateyama et al.

[11] Patent Number: 5,372,903
[45] Date of Patent: Dec. 13, 1994

[54] METHOD OF FORMING A PHOSPHOR LAYER ON CRT PANEL AND A WATER SOLUBLE EMULSION WITH PHOTOSENSITIVITY FOR AN INTERMEDIATE LAYER

[75] Inventors: Norihiro Tateyama, Saitama; Katsutoshi Ohno, Tokyo; Tsuneo Kusunoki, Kanagawa; Hiroshi Itoh, Tochigi; Shuichi Nakazato, Tochigi; Naoki Isobe, Tochigi, all of Japan

[73] Assignees: Sony Corporation; Oji Kako, Co., Ltd., both of Tokyo, Japan

[21] Appl. No.: 12,946

[22] Filed: Feb. 3, 1993

[30] Foreign Application Priority Data

Feb. 4, 1992 [JP] Japan .................................. 4-019104

[51] Int. Cl.$^5$ ................................................ G03C 5/00
[52] U.S. Cl. ........................................ 430/23; 430/26; 427/68
[58] Field of Search ...................... 430/23, 27, 28, 270; 427/64, 68

[56] References Cited

U.S. PATENT DOCUMENTS 5,073,463 12/1991 Fujita ..................................... 430/23
5,134,047 7/1992 Inada et al. ........................... 430/28

Primary Examiner—Steve Rosasco
Attorney, Agent, or Firm—Hill, Steadman & Simpson

[57] ABSTRACT

Respective phosphor layers (3R), (3G) and (3B) and a light absorption layer (2) are formed on the inner surface of a panel. An intermediate layer (11) is selectively formed on the surfaces of the respective phosphor layers by using a water soluble liquid having photosensitivity and containing water dispersion vinyl polymer emulsion and partial saponification polyvinyl acetate-system photosensitizer and then a metal-backing layer (12) is formed. A color purity of a phosphor screen can be increased and a brightness thereof can be improved.

21 Claims, 3 Drawing Sheets

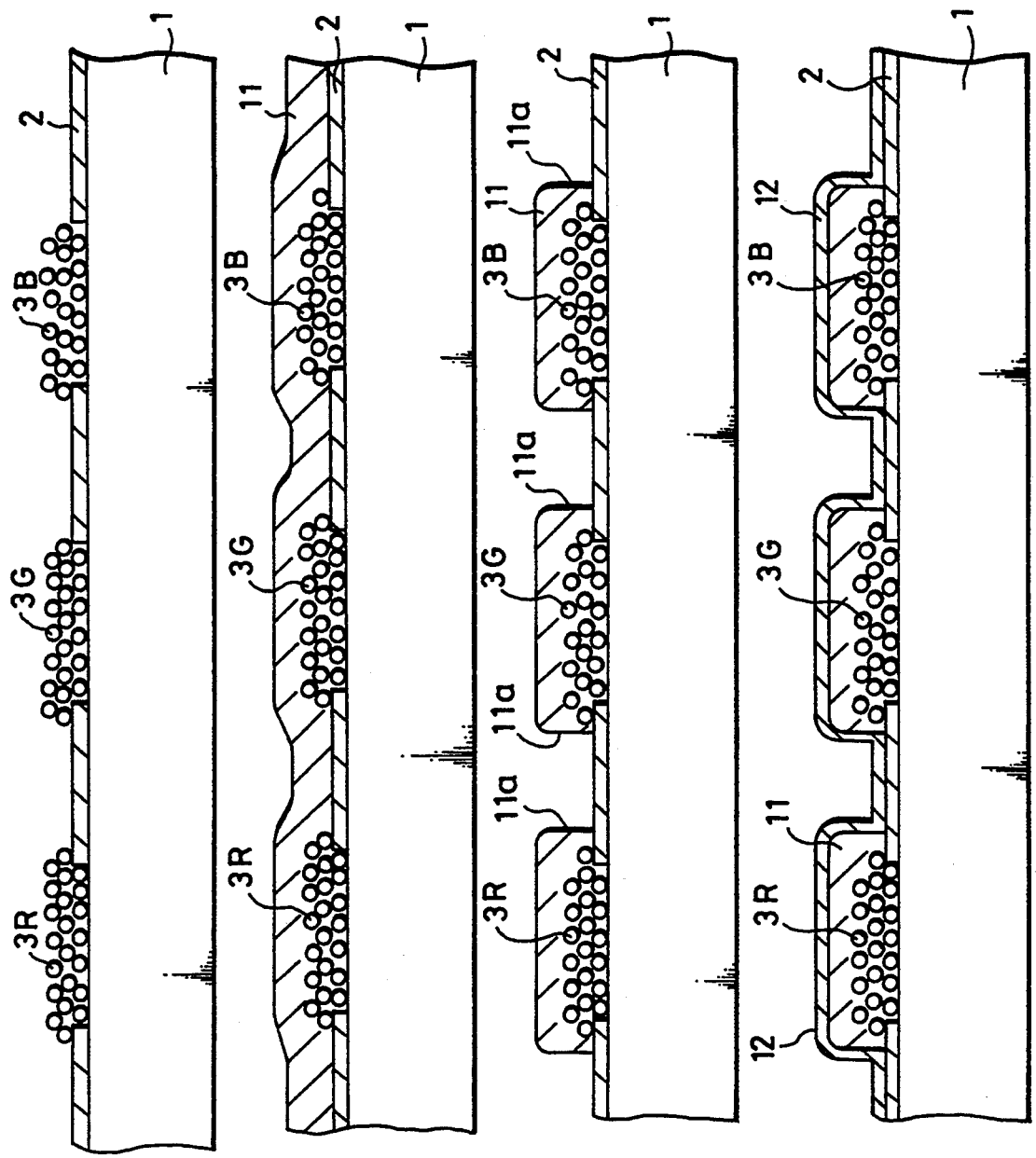

METHOD OF FORMING A PHOSPHOR LAYER ON CRT PANEL AND A WATER SOLUBLE EMULSION WITH PHOTOSENSITIVITY FOR AN INTERMEDIATE LAYER

BACKGROUND OF THE INVENTION

1. Field of the Invention

The present invention relates to a method of forming a phosphor layer on a cathode ray tube (CRT) panel and a water soluble emulsion with photosensitivity as an intermediate layer thereof.

2. Description of the Prior Art

In general, a phosphor screen of a color cathode ray tube includes red, green and blue phosphor layers (e.g., phosphor stripes or phosphor dots) formed on an inner surface of a panel and a carbon layer serving as a light absorption layer formed between the respective phosphor layers. A metal-backing layer made of an aluminum vapor deposited film is formed on the surface of the phosphor screen through an intermediate layer that is used to smooth the surface of the phosphor layer. The intermediate layer is evaporated and removed by the succeeding baking process.

Such a color phosphor screen is generally formed as shown in FIGS. 1A through 1C.

Initially, a PVA (polyvinyl alcohol) photosensitive film is coated on the inner surface of a panel 1. Then, using color selection electrodes as masks, it is exposed to three red, green and blue lights and developed to form resist layers made of the PVA photosensitive film of the portions in which respective color phosphor layers, e.g., respective color phosphor stripes are to be formed. After the hard film treatment, a carbon slurry is coated on the whole surface including the resist layers, dried, inverted and then developed to thereby remove the carbon layer together with the resist layers, whereby a carbon stripe 2 is formed on portions located between the respective phosphor stripes which will be formed hereinafter. Then, respective color phosphor stripes 3 [3R, 3G and 3B] corresponding to red (R), green (G) and blue (B) are formed by a slurry method (see FIG. 1A).

An acrylic layer (e.g., acrylic emulsion manufactured under the trade name of PRIMAL B-74, C-72, AC-73 or the like by NIPPON ACRYL KABUSHIKI KAISHA or manufactured under the trade name of LUSITE (acrylic resin is dissolved in toluene) by TOKYO OHKA KOGYO KABUSHIKI KAISHA) serving as an intermediate layer 4 having high smoothing property is coated on the whole surface including the carbon stripe 2 and the phosphor stripe 3 (see FIG. 1B).

Then, a metal-backing layer 5 made of an aluminum evaporating layer is formed on the intermediate layer 4 (see FIG. 1C ). Thereafter, the intermediate layer 4 is evaporated and then removed by the baking treatment, thereby a desired color phosphor screen is formed.

A pitch of earth of the respective phosphor stripes 3 [3R, 3G, 3B] on the phosphor screen is made finer as the color cathode ray tube becomes high in grade and high in definition. As a result, when the PRIMAL (trade name), for example, is used as the intermediate layer 4, the smooth intermediate layer 4 cannot be formed on the surface of the phosphor stripe 3 without difficulty.

That is, since the surface tension of PRIMAL is small, the PRIMAL permeates the phosphor stripe 3 and also the PRIMAL flows onto the carbon stripe 2. Therefore, the smooth intermediate layer 4 cannot be formed. There is then the disadvantage that the brightness of the phosphor screen is lowered.

If the intermediate layer 4 is increased in film thickness, then the smoothing property thereof is improved. In this case, however, during the furnace process, the metal-backing layer 5 is floated, i.e., aluminum is floated (so-called aluminum swell) or aluminum is peeled off.

On the other hand, if the LUSITE (trade name) is used to form the intermediate layer 4, then the smooth intermediate layer 4 is formed. In this case, however, the portion on the carbon stripe 2 is empty so that color purity is deteriorated due to scattering of light, a reflected electron or the like.

OBJECTS AND SUMMARY OF THE INVENTION

In view of the aforesaid shortcomings and disadvantages of the prior art, it is an object of the present invention to provide a method of forming a phosphor screen of a cathode ray tube whose metal-backing layer can be prevented from being floated and coming off.

Another object of the present invention is to provide a method of forming a phosphor screen of a cathode ray tube which is excellent in brightness and color purity.

A further object of the present invention is to provide a water soluble emulsion having photosensitivity used to form an intermediate layer when such phosphor screen is formed.

Yet a further object of the present invention is to provide a method of forming a phosphor screen of a cathode ray tube which is suitable for forming a phosphor screen of a high definition color cathode ray tube.

Still a further object of the present invention is to provide a water soluble emulsion having photosensitivity which is suitable for forming a phosphor screen of a high definition color cathode ray tube.

According to a first aspect of the present invention, there is provided a method of forming a phosphor layer of a cathode ray tube which comprises the steps of forming respective phosphor layers and a light absorption layer between the respective phosphor layers on an inner surface of a panel, selectively forming an intermediate layer on the surface of each of the phosphor layer, and forming a metal-backing layer thereafter.

According to a second aspect of the present invention, there is provided a method of forming a phosphor layer of a cathode ray tube which comprises the steps of forming respective phosphor layers and a light absorption layer between the respective phosphor layers on an inner surface of a panel, selectively forming an intermediate layer over a range of from the surface of the phosphor layer to one portion of the light absorption layer, and forming a metal-backing layer thereafter.

According to a third aspect oil of the present invention, there is provide a water soluble emulsion having photosensitivity for an intermediate layer which is composed of water dispersion vinyl polymerization emulsion.

According to a fourth aspect of the present invention, there is provided a water soluble emulsion having photosensitivity for an intermediate layer which contains water dispersion vinyl polymerization emulsion and partial saponification polyvinyl-system photosensitive agent.

According to a fifth aspect of the present invention, there is provided a water soluble emulsion having photosensitivity for an intermediate layer which contains water dispersion vinyl polymerization emulsion, more than one kind of ethylene unsaturated compound selected from acrylic ester and methacrylate ester into which a photo polymerization initiator is dissolved and emulsified dispersion liquid of a partial saponification polyvinyl-system photosensitive agent.

According to a sixth aspect of the present invention, there is provided a water soluble emulsion having photosensitivity for an intermediate layer which is composed of more than one kind of ethylene unsaturated compound selected from acrylic ester and methacrylate ester into which a photo polymerization initiator is dissolved and emulsified dispersion liquid of partial saponification polyvinyl acetate.

According to a seventh aspect of the present invention, there is provided a water soluble emulsion having photosensitivity for an intermediate layer, wherein the water dispersion vinyl polymerization emulsion is polymerized by using more than one kind of water soluble macromolecule selected from complete saponification polyvinyl acetate, partial saponification polyvinyl acetate, water soluble cellulose derivative, gelatin, gelatin derivative, starch and starch derivative as a protecting colloid agent.

According to an eighth aspect of the present invention, there is provided a water soluble emulsion having photosensitivity for an intermediate layer wherein the water dispersion vinyl polymerization emulsion is polymerized by using a surface-active agent as an emulsifier.

According to a ninth aspect of the present invention, there is provided a water soluble emulsion having photosensitivity for an intermediate layer, wherein the water dispersion vinyl polymerization emulsion is polymerized by using more than one kind of water soluble macromolecule selected from surface-active agent, complete saponification polyvinyl acetate, partial saponification polyvinyl acetate, water soluble cellulose derivative, complete saponification polyvinyl acetate derivative, partial polyvinyl acetate derivative, gelatin, gelatin derivative, starch and starch derivative as a protecting colloid agent.

According to a tenth aspect of the present invention, there is provided a water soluble emulsion having photosensitivity for an intermediate layer, wherein the waver dispersion vinyl polymerization emulsion is a polymerization of more than one kind of ethylene unsaturated compound selected from acrylic acid, methacrylic acid, acrylic alkylester and methacrylic alkylester.

According to an eleventh aspect of the present invention, there is provided a water soluble emulsion having photosensitivity for an intermediate layer, wherein a photosensitive agent in water soluble emulsion having photosensitivity is selected from diazo compound and dichromate.

According to a twelfth aspect of the present invention, there is provided a water soluble emulsion having photosensitivity for an intermediate layer, wherein partial saponification polyvinyl acetate-system photosensitive agent is a mixture of partial saponification polyvinyl acetate and diazo compound.

According to a thirteenth aspect of the present invention, there is provided a water soluble emulsion having photosensitivity for an intermediate layer, wherein partial saponification polyvinyl acetate-system photosensitive agent is a mixture of partial saponification polyvinyl acetate and dichromate.

According to a fourteenth aspect of the present invention, there is provided a water soluble emulsion having photosensitivity for an intermediate layer, wherein partial saponification vinyl acetate-system photosensitive agent is condensate of partial saponification polyvinyl acetate and more than one kind of photosensitive compound selected from styrylpyridinium salt compound and styrylquinolinium salt compound.

According to a fifteenth aspect of the present invention, there is provided a water soluble emulsion having photosensitivity for an intermediate layer, wherein water dispersion vinyl polymerization emulsion is polymerized by using more than one kind of water soluble macromolecule selected from complete saponification polyvinyl acetate, partial saponification polyvinyl acetate, water soluble cellulose derivative, complete saponification polyvinyl acetate derivative, partial saponification polyvinyl acetate derivative, gelatin, gelatin derivative, starch and starch derivative as a protecting colloid agent, and more than one kind of photosensitive compound selected from styrylpyridinium salt compound and styrylquinolinium salt compound is added and condensated into water soluble macromolecule acting as the protecting colloid agent.

According to a sixteenth aspect of the present invention, there is provided a water soluble emulsion having photosensitivity for an intermediate layer, wherein a weight ratio of weight (A) of ethylene unsaturated compound constituting water dispersion vinyl polymerization emulsion and weight (B) of water soluble macromolecule utilized as the protecting colloid agent when the emulsion is polymerized falls in a range of from (A):(B)=99:1 to 10:90.

According to a seventeenth aspect of the present invention, there is provided a water soluble emulsion having photosensitivity for an intermediate layer, wherein a weight ratio of weight (A) of ethylene unsaturated compound constituting water dispersion vinyl polymerization emulsion, weight (B) of water soluble macromolecule utilized as the protecting colloid agent when the emulsion is polymerized and weight (C) of partial saponification polyvinyl acetate contained in partial saponification polyvinyl acetate-system photosensitive agent falls in a range of from [(A)+(B)]: (C)=99:1 to 10:90.

According to an eighteenth aspect of the present invention, there is provided a water soluble emulsion having photosensitivity for an intermediate layer, wherein a weight ratio of weight (A) of ethylene unsaturated compound constituting water dispersion vinyl polymerization emulsion, weight (B) of water soluble macromolecule utilized as the protecting colloid agent when the emulsion is polymerized, weight (C) of ethylene unsaturated compound into which a photo polymerization initiator is dissolved and weight (D) of partial saponification polyvinyl acetate contained in partial saponification polyvinyl acetate-system photosensitive agent falls in a range of from [(A)+(C)]:[(B)+(D)]=99:1 to 10:90.

According to a nineteenth aspect of the present invention, there is provided a water soluble emulsion having photosensitivity for an intermediate layer, wherein weight (A) of ethylene unsaturated compound into which a photo polymerization initiator is dissolved and weight (B) of partial saponification polyvinyl acetate contained in partial saponification polyvinyl acetate-system photosensitive agent falls in a range of from (A):(B)=99:1 to 10:90.

According to a twentieth aspect of the present invention, there is provided a water soluble emulsion having photosensitivity for an intermediate layer, wherein in the emulsified dispersion liquid, ethylene unsaturated compound into which a photo polymerization initiator is dissolved is emulsified by action of polar group contained in a surface-active agent or ethylene unsaturated compound and then mixed with partial saponification polyvinyl acetate-system photosensitive agent.

According to a twenty first aspect of the present invention, there is provided a water soluble emulsion having photosensitivity for an intermediate layer, wherein in the emulsified dispersion liquid, ethylene unsaturated compound into which a photo polymerization initiator is dissolved is emulsified by action of more than one kind of water soluble macromolecule selected from complete saponification polyvinyl acetate, partial saponification polyvinyl acetate, water soluble cellulose derivative, complete saponification polyvinyl acetate derivative, partial saponification polyvinyl acetate derivative, gelatin, gelatin derivative, starch and starch derivative and then mixed with partial saponification polyvinyl acetate-system photosensitive agent.

According to a twenty second aspect of the present invention, there is provided a water soluble emulsion having photosensitivity for an intermediate layer, wherein in the emulsified dispersion liquid, ethylene unsaturated compound into which a photo polymerization initiator is dissolved is emulsified by a parallel use, of more than one kind of water soluble macromolecule selected from complete saponification polyvinyl acetate, partial saponification polyvinyl acetate, water soluble cellulose derivative, complete saponification polyvinyl acetate derivative, partial saponification polyvinyl acetate derivative, gelatin, gelatin derivative, starch and starch derivative and a surface-active agent and then mixed with partial saponification polyvinyl acetate-system photosensitive agent.

According to the method of forming a phosphor screen of the present invention, in the phosphor screen having the phosphor layers and the light absorption layer between the phosphor layers formed on the inner surface of the panel, the intermediate layer is selectively formed on the surfaces of the respective phosphor layers or the intermediate layer is selectively formed so as to overlap one portion of the light absorption layer from the surface of the phosphor layers, whereby the intermediate layer on the effective picture screen can be increased in film thickness. Therefore, the smooth intermediate layer can be formed on the surface of the phosphor layers, which can improve a brightness of the phosphor screen.

Since the intermediate layer is not formed on the light absorption layer outside the effective picture screen, the metal-backing layer can be prevented from being refloated, coming off, i.e., the occurrence of floating of aluminum and coming-off of aluminum can be avoided.

Further, since the metal-backing layer is formed so as to envelope the respective phosphor layers, a light rendered luminous in the phosphor layers can be reflected by the metal-backing layer reliably and can be prevented from being introduced into the adjacent phosphor layers, which can increase a color purity.

On the other hand, by using the water soluble emulsion having photosensitivity of the present invention, the intermediate layer can be selectively formed on the surface of the phosphor layers or formed so as to overlap one portion of the light absorption layer.

Since the water soluble emulsion having photosensitivity with the above-mentioned characteristics can be developed easily with water and can be satisfactorily evaporated and removed by heating, a uniform metal-backing layer having high smooth property can be formed on the respective phosphor layers finally.

The above and other objects, features, advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIGS. 2A through 2D are respectively process diagrams showing an embodiment of a method of forming a phosphor screen according to the present invention.

DETAILED DESCRIPTION OF THE PREFERRED EMBODIMENTS

Figure 1A:
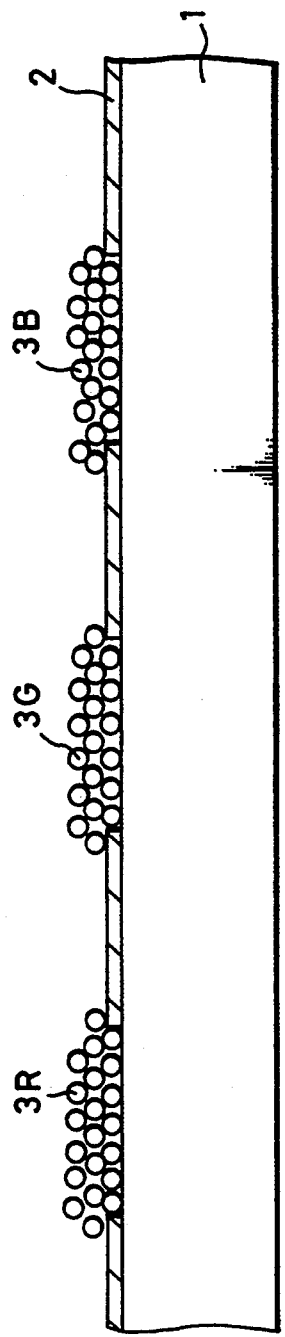
FIGS. 1A through 1C are respectively process diagrams showing a conventional method of forming a phosphor screen.
Figure 1B:
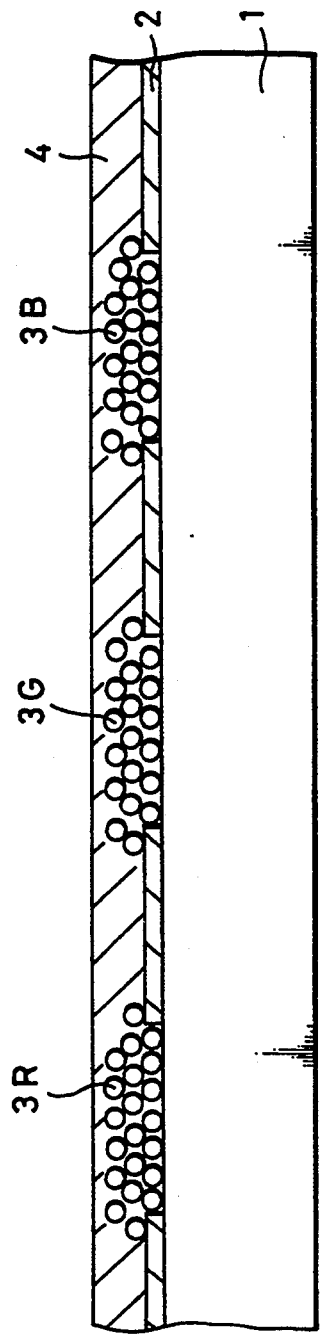
Figure 1C:
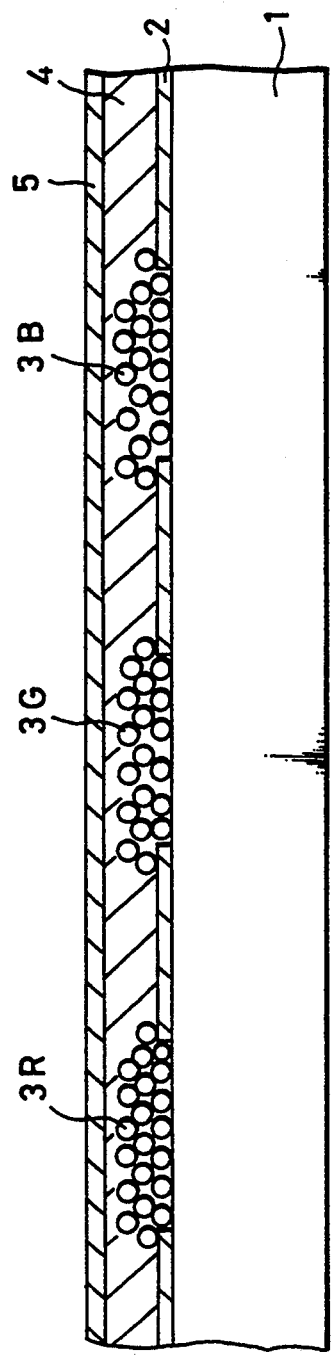

An embodiment of the method of forming a phosphor screen of a cathode ray tube and a water soluble emulsion with photosensitivity for an intermediate layer used in the method according to the present invention will hereinafter be described with reference to the drawings.

FIG. 2A to 2D are respectively process diagrams showing an embodiment of the method of forming a color phosphor screen according to the present invention. While a phosphor stripe is used as a phosphor layer in this embodiment, the present invention is not limited thereto and can be applied to the case such that a phosphor dot may be used as the phosphor layer with similar action and effects being achieved.

In this embodiment, as shown in FIG. 2A, phosphor stripes 3 [3R, 3G, 3B] corresponding to red (R), green (G) and blue (B) and carbon stripes 2 serving as light-absorption layers adjacent the phosphor stripes 3 are formed on the inner surface of the panel 1 by an ordinary method.

That is, similarly as described above, a PVA (polyvinyl alcohol) photosensitive film is coated on the inner surface of the panel 1. Then, by using color selecting electrodes (aperture grills) as masks, the photosensitive film is exposed to three color lights of red, green and blue and developed to form a resist layer made of the PVA photosensitive film on the portions in which respective color phosphor stripes should be formed. Then, after the curing process, a carbon slurry is coated on the whole surface including the resist layer, dried and treated by an inversion development to remove the carbon layer together with the resist layer, whereby the carbon stripes 2 are formed on the portions between the respective color phosphor stripes which will be formed hereinafter.

Then, a phosphor slurry in which phosphor particles are mixed into a photosensitive binder, e.g., polyvinyl alcohol is uniformly coated on the inner surface of the panel 1 on which the carbon stripes 2 are formed and then exposed by ultraviolet rays by using the color selecting electrodes as masks, thereby the phosphors being optically cured in a stripe shape. Then, non-exposed portions are removed by the development treatment. This process is carried out for each of red, green and blue phosphors, thereby forming respective color phosphor stripes 3 [3R. 3G, 3B] between the respective corresponding carbon stripes 2.

As shown in FIG. 2B, a water soluble emulsion with photosensitivity selected from examples 1 to 6, which will be described later, is coated on the whole of the surface including the phosphor stripes 3 and the carbon stripes 2 by a rotary coating method and then dried to form an intermediate layer 11. In this case, the intermediate layer 11 is formed so as to have a thickness four to five times as thick as that of the normal intermediate layer. Uneven surfaces of the respective phosphor stripes 3R, 3G and 3B are smoothed by the intermediate layer 11.

Then, by using the color selecting electrodes as masks, the intermediate layer 11 is exposed (internal-exposure method) at its positions corresponding to the respective red, green and blue color phosphor strips 3R, 3G and 3B by the radiation of ultraviolet rays. Thereafter, the product is developed in hot water and dried to thereby selectively form the intermediate layer (acrylic layer) 11 only on the surface of the respective phosphor stripes 3R, 3G and 3B, i.e., on the rear and side surfaces thereof.

The selective exposure method for the intermediate layer 11 is not limited to the above-mentioned internal exposure method. Alternatively, according to a so-called outer exposure method in which the intermediate layer 11 is exposed from the outer surface of the panel 1, for example, by using the carbon stripes 2 as masks, the intermediate layers 11 can be selectively formed only on the surfaces of the respective phosphor stripes 3 as shown in FIG. 2C.

Then, as shown in FIG. 2D, a metal-backing layer 12 made of, for example, an aluminum-evaporating film is formed by an ordinary method. Then, the product is treated by the baking treatment. In this way, a desired color phosphor screen can be obtained.

Embodiments of water soluble emulsion with photosensitivity utilized as the intermediate layer 11 will be described next.

[EMBODIMENT 1]

Composition (1) polyacrylic acid butyl emulsion . . .100 g where concentration of solid component thereof: 25% protecting colloid agent: partial saponification polyvinyl acetate (degree of polymerization 300, degree of saponification 78 mol %), protecting colloid agent weight/polyacrylic acid butyl weight: 10/90.

(2) partial saponification polyvinyl acetate aqueous solution . . . 25 g where concentration of solid component thereof: 10% degree of polymerization: 1,800 degree of saponification: 88 mol %.

(3) bichromic acid ammonium salt . . . 0.05 g

The aforesaid compositions are mixed and dissolved to obtain a water soluble photosensitive solution for the intermediate layer.

[EMBODIMENT 2]

Composition (1) poly-2-ethylhexylacrylate emulsion . . . 100 g where concentration of solid component thereof: 25% protecting colloid agent: partial saponification polyvinyl acetate (degree of polymerization 1400, degree of saponification 78 mol %) protecting colloid agent weight/poly-2-ethylhexylacrylate weight: 7/93.

(2) condensate compound aqueous solution of partial saponification polyvinyl acetate and N-methyl-4-(P-formylstyryl) pyridiniummethosulfate . . . 20 g where concentration of solid component thereof . . . 10% partial saponification polyvinyl acetate: degree of polymerization 1800, degree of saponification 88 mol %, water soluble group of partial saponification polyvinyl acetate substituted with N-methyl-4-(P-formylstyryl) pyridiniummethosulfate: 1 mol %.

The aforesaid compositions are mixed to obtain a water soluble photosensitive solution for the intermediate layer.

EMBODIMENT 3

Composition (1) polyacrylic acid butyl emulsion . . . 100 g where concentration of solid component thereof: 25 g protecting colloid agent: carboxymethylcellulose protecting colloid agent weight/polyacrylic acid butyl weight: 10/90.

(2) partial saponification polyvinyl acetate aqueous solution . . . 20 g where concentration of solid component thereof: 10 g degree of polymerization: 2400 degree of saponification: 92 mol %.

(3) polycondensate of diazophenylamine and formaldehyde . . . 0.3 g

The aforesaid compositions are mixed and dissolved to obtain a water soluble photosensitive solution for the intermediate layer.

[EMBODIMENT 4]

Composition (1) polyacrylic acid butyl emulsion, i.e., N-methyl-4-(P-formylstyryl)pyridiniummethosulfate made by condensation of 1 mol % of hydroxyl group of partial saponification polyvinyl acetate serving as protecting colloid contained in polyacrylic acid butyl emulsion shown in the embodiment 1 . . . 100 g where concentration of solid component: 25%.

(2) condensate compound aqueous solution of partial saponification polyvinyl acetate and N-methyl-4-(P-formylstyryl) pyridiniummethosulfate shown in the embodiment 2 . . . 10 g The above-mentioned compositions are mixed to obtain a water soluble emulation having photosensitivity for the intermediate layer.

[EMBODIMENT 5]

(1) polyacrylic acid butyl emulsion shown in the embodiment 1 . . . 100 g (2) an emulsified Liquid provided by emulsifying and dispersing 50 g of tridecimethacrylate in which 1 g of IRGACURE651 (manufactured by CIBA-GEIGY A.G.) is dissolved as a photo polymerization initiator by 25 g of partial saponification polyvinyl acetate aqueous solution shown in the embodiment 1; and (3) bichromic acid ammonium . . . 0.05 g The above-mentioned compositions are mixed and dissolved to obtain a water soluble emulsion having photosensitivity for the intermediate layer.

[EMBODIMENT 6]

Composition (1) an emulsified liquid provided by emulsifying and dispersing 50 g of tridecimethacrylate in which 1 g of IRGACURE651 (manufactured by CIBA-GEIGY A.G.) is dissolved as a photo polymerization initiator by 25 g of partial saponification polyvinyl acetate aqueous solution shown in the embodiment 1; and (2) bichromic acid ammonium . . . 0.05 g The above-mentioned compositions are mixed and dissolved to obtain a water soluble emulsion having photosensitivity for the intermediate layer.

According to the above-mentioned method of forming a phosphor screen, since the intermediate layer 11 is selectively formed on the surface of each of the respective color phosphor stripes, i.e., rear and side surfaces thereof by using the water soluble emulsion having photosensitivity shown in the embodiments 1 to 6, the intermediate layer 11 can be made thick in film thickness.

More specifically, the intermediate layer 11 is not formed on the carbon stripe 2. Accordingly, the intermediate layer 11 is not continuously formed on the whole surface of the panel 1 but is formed to have stepped surfaces 11a in accordance with each of the phosphor stripes 3. On the stepped surfaces 11a, the aluminum-evaporating film serving as the metal-backing layer 12 is reduced in thickness. Therefore, during the baking process, gas of organic material such as PVA or the like contained in the intermediate layer 11 or the phosphor stripes 3 is escaped through this stepped surfaces 11a and then discharged.

For this reason, the intermediate layer 11 can be made thick in film thickness and hence the uneven surface of each of the phosphor stripes 3 can be smoothed. Therefore, the metal-backing layer 12 having high reflectivity can be formed, which can increase brightness of the phosphor screen by 30% as compared with that of the prior art.

Since it is natural that the intermediate layer 11 is not formed on the carbon layer outside the effective picture screen, disadvantages such as floating of aluminum (swell of aluminum), coming-off of aluminum or the like can be avoided also in the outside of the effective picture screen.

Further, since the metal-backing layer 12 is formed so as to envelope each of the respective phosphor stripes 3R, 3G and 3B, lights rendered luminous on the respective phosphor stripes 3 can be prevented from becoming incident on the adjacent phosphor stripes and can be reflected by the metal-backing layer 12 reliably. Accordingly, color purity in the cathode ray tube can be increased.

In the CIE chromaticity diagram, it was confirmed that X value of red chromaticity was increased by +0.02, Y value of blue chromaticity was decreased by −0.05 and Y value of green chromaticity was increased by +0.005.

On the other hand, according to the embodiments of the water soluble emulsion having photosensitivity of the present invention, the non-exposed portions presented after the exposure can be developed easily with water. Also, the water soluble emulsion after the metal-backing layer 12 was formed can be satisfactorily evaporated and removed in the baking process.

According to the embodiments of the present invention, if ethylene unsaturated compound utilized in water dispersion vinyl polymer emulsion is selected from one of acrylic acid, methacrylic acid, acrylic acid alkyl ester and methacrylic acid alkyl ester, then the above-mentioned ethylene unsaturated compound becomes excellent in evaporation removal property as compared with water dispersion vinyl polymer emulsion made of other ethylene unsaturated compounds than those mentioned above.

In this connection, the water soluble emulsion having photosensitivity made of water dispersion vinyl polymer emulsion in which a conventional surface-active agent is polymerized as a dispersion stabilizer and a partial saponification polyvinyl acetate vinyl-system photosensitizer cannot be dissolved again into the above water dispersion vinyl polymer emulsion inherently. There is then the drawback that the non-exposed portion cannot be developed with water satisfactorily after the exposure. As a means for improving the above water development property with the above mixture, there is known a method in which water soluble emulsion having photosensitivity is prepared by mixing a solid component of partial saponification polyvinyl acetate which can be dissolved into water again excellently into a solid component of water soluble emulsion having photosensitivity by an amount in excess of 50%.

However, if the mixing amount of partial saponification polyvinyl acetate exceeds 50%, then there occurs a new drawback such that the partial saponification polyvinyl acetate which is poor in evaporation removal property cannot be evaporated and removed in the process (baking process) in which the organic material left after the aluminum evaporation film serving as the metal-backing layer was formed is evaporated and removed by heating process. Consequently, a brightness of the phosphor screen in which the water soluble emulsion having photosensitivity made by the above-mentioned method is utilized as, the intermediate layer is lowered contrary to expectation.

On the contrary, the water soluble emulsion having photosensitivity according to the embodiments of the present invention is excellent in water development property and becomes satisfactory in evaporation removal property, which can as a result improve the brightness.

While the intermediate layers 11 are selectively formed so as to cover the surfaces of the respective phosphor stripes 3 in the embodiment shown in FIGS. 2A through 2D, the present invention is not limited thereto. As shown in FIGS. 3A through 3D, the intermediate layer 11 may be formed so as to cover one portion of the carbon stripe 2 from the surface 3 of the phosphor stripe 3.

Figure 3A:
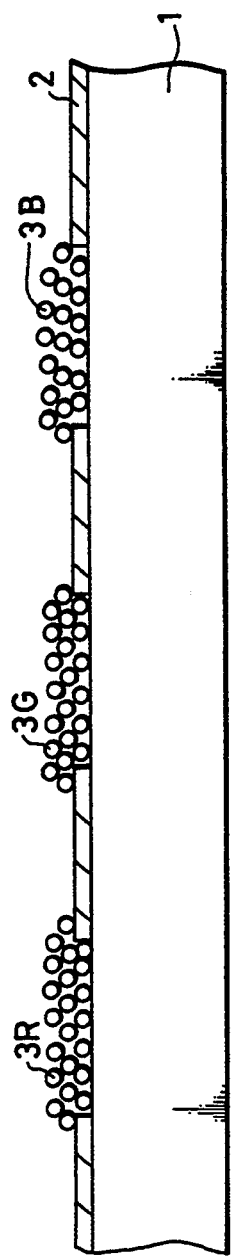
FIGS. 3A through 3D are respectively process diagrams showing another embodiment of a method of forming a phosphor screen according to the present invention.
Figure 3B:
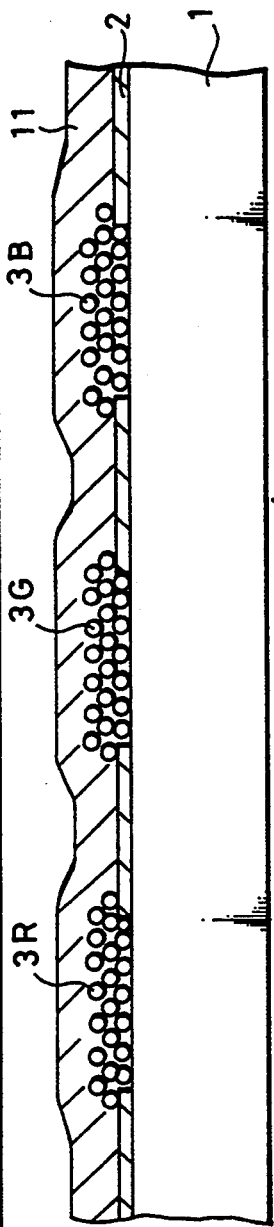
Figure 3C:
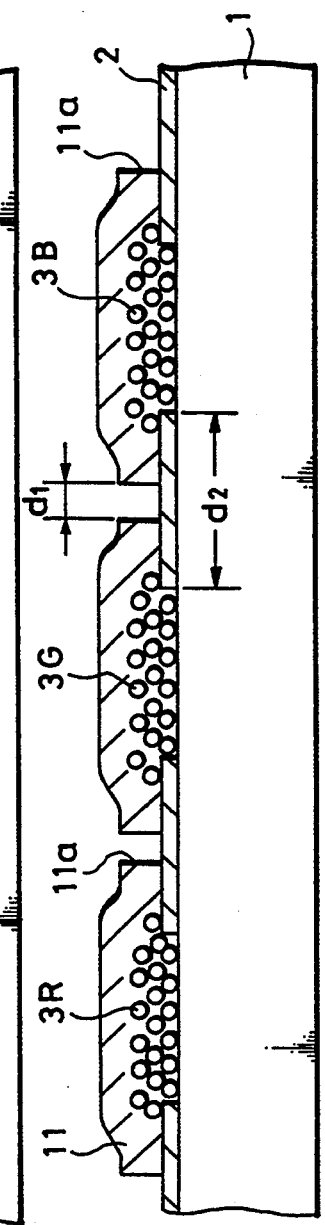
Figure 3D:
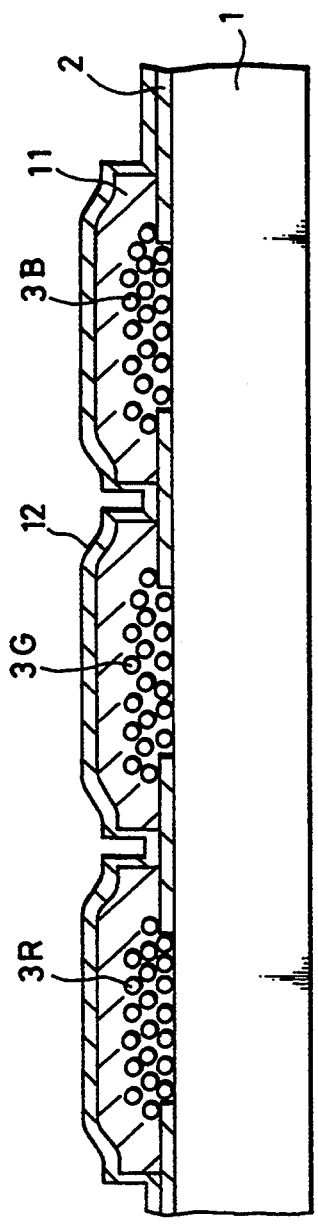

In this case, a width $d_1$ of a portion in which the intermediate layer 11 is not formed on the carbon stripe 2 falls within a range of from 0.01% to 99.9% of a width $d_2$ of the carbon stripe 2 as shown in FIG. 3C. In other words, in the backing process carried out after the metal-backing layer 12 was formed, there must be provided the spacing $d_1$ that is sufficient to escape organic gas through the stepped surface 11a of the intermediate layer 11.

In the processes shown in FIGS. 3A through 3D, processes other than the process in which the intermediate layer 11 is formed so as to partly cover the carbon stripe 2 by controlling the exposure are similar to those of FIGS. 2A to 2D and therefore need not be described in detail. According to this method, similarly to the above-mentioned embodiment, since the uneven surface of the phosphor stripe 3 can be smoothed and the metal-backing layer 12 having high reflectivity can be formed, the brightness can be improved. Also, the metal-backing layer 12 can be avoided from being floated and coming off and the color purity of phosphor screen can be improved.

According to the present invention, it is possible to form a phosphor screen of a cathode ray tube in which the brightness can be increased, the color purity can be increased, the metal-backing layer can be prevented from being floated and coming off and the reliability thereof can be increased. Therefore, the present invention is suitable for use in forming a phosphor screen of a high definition color cathode ray tube.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A method of forming a layer of phosphor strips of a cathode ray tube comprising the steps of:
   forming a layer of respective phosphor strips and light absorption strips between the respective phosphor strips on an inner surface of a panel;
   coating an intermediate layer material on surfaces of said phosphor strips and said light absorption strips;
   exposing and developing said intermediate layer material thereby selectively forming an intermediate layer on the phosphor strips with the absorption strips being substantially free of the intermediate layer;
   forming a metal-backing layer on the intermediate layer and exposed portion of the absorption strips.

2. A method according to claim 1, wherein the composition of said intermediate layer is composed of a water dispersion vinyl polymerization emulsion and a photosensitive agent.

3. A method according to claim 2, wherein the composition of said intermediate layer, said photosensitive agent is selected from diazo compound and dichromate.

4. A method according to claim 2, wherein the composition of said intermediate layer, said water dispersion vinyl polymerization emulsion is polymerized by using a partial saponification polyvinyl acetate as a protecting colloid agent or both the partial saponification polyvinyl acetate and a surface-active agent as a protecting colloid agent.

5. A method according to claim 2, wherein in the composition of said intermediate layer, said water dispersion vinyl polymerization emulsion is a polymerization of more than one kind of ethylene unsaturated compound selected from acrylic acid, methacrylic acid, acrylic alkylester and methacrylic alkylester.

6. A method according to claim 2, wherein the composition of said intermediate layer is selected such that a weight ratio of weight A of ethylene unsaturated compound constituting water dispersion vinyl polymerization emulsion and weight B of the partial saponification polyacetate vinyl utilized as the protecting colloid agent when said emulsion is polymerized falls in a ratio of A:B in a range of 99:1 to 10:90.

7. A method according to claim 1, wherein the composition of said intermediate layer is composed of water dispersion vinyl polymerization emulsion, a partial saponification polyacetate vinyl and a photosensitive agent.

8. A method according to claim 7, wherein in the composition of said intermediate layer, said photosensitive agent is selected from diazo compound and dichromate.

9. A method according to claim 7, wherein in the composition of said intermediate layer, said water dispersion vinyl polymerization emulsion is polymerized by using a partial saponification polyvinyl acetate as a protecting colloid agent or both the partial saponification polyvinyl acetate and a surface-active agent as a protecting colloid agent.

10. A method according to claim 7, wherein in the composition of said intermediate layer, said water dispersion vinyl polymerization emulsion is a polymerization of more than one kind of ethylene unsaturated compound selected from acrylic acid, methacrylic acid, acrylic alkylester and methacrylic alkylester.

11. A method according to claim 7, wherein the composition of said intermediate layer is selected such that a weight ratio of weight A of ethylene unsaturated compound constituting water dispersion vinyl polymerization emulsion and weight B of the partial saponification polyacetate vinyl utilized as the protecting colloid agent when said emulsion is polymerized falls in a ratio of A:B in a range of 99:1 to 10:90.

12. A method according to claim 7, wherein the composition of said intermediate layer is selected such that a weight ratio of weight A of ethylene unsaturated compound constituting water dispersion vinyl polymerization emulsion, weight B of partial saponification polyvinyl acetate constituting water dispersion vinyl polymerization emulsion utilized as the protecting colloid agent when said emulsion is polymerized, and weight C of partial saponification polyvinylacetate other than that constituting the water dispersion vinyl polymerization falls in a ratio of (A):(B+C) in a range of 99:1 to 10:90.

13. A method according to claim 1, wherein the composition of said intermediate layer is composed of water dispersion vinyl polymerization emulsion in which more than one kind of photosensitive compound selected from styrylpyridinium salt compound and styrylquinolinium salt compound is added to a partial saponification polyvinyl acetate acting as protecting colloid as photosensitive radical.

14. A method according to claim 13, wherein in the composition of said intermediate layer, said water dispersion vinyl polymerization emulsion is polymerized by using a partial saponification polyvinyl acetate as a protecting colloid agent or both the partial saponification polyvinyl acetate and a surface-active agent as a protecting colloid agent.

15. A method according to claim 13, wherein in the composition of said intermediate layer, said water dispersion vinyl polymerization emulsion is a polymerization of more than one kind of ethylene unsaturated compound selected from acrylic acid, methacrylic acid, acrylic alkylester and methacrylic alkylester.

16. A method according to claim 13, wherein the composition of said intermediate layer is selected such that a weight ratio of weight A of ethylene unsaturated compound constituting water dispersion vinyl polymerization emulsion and weight B of the partial saponification poly acetate vinyl utilized as the protecting colloid agent when said emulsion is polymerized falls in a ratio of A:B in a range of 99:1 to 10:90.

17. A method according to claim 1, wherein the composition of said intermediate layer is composed of a partial saponification poly vinyl acetate to which more than one kind of photosensitive compound selected from styrylpyridinium salt compound and styrylquinolinium salt compound is added as photosensitive radical and water dispersion vinyl polymerization emulsion in which more than one kind of photosensitive compound selected from styrylpyridinium salt compound and styrylquinolinium salt compound is added to a partial saponification poly vinyl acetate serving as protecting colloid as photosensitive radical.

18. A method according to claim 17, wherein in the composition of said intermediate layer, said water dispersion vinyl polymerization emulsion is polymerized by using a partial saponification polyvinyl acetate as a protecting colloid agent or both the partial saponification polyvinyl acetate and a surface-active agent as a protecting colloid agent.

19. A method according to claim 17, wherein in the composition of said intermediate layer, said water dispersion vinyl polymerization emulsion is a polymerization of more than one kind of ethylene unsaturated compound selected from acrylic acid, methacrylic acid, acrylic alkylester and methacrylic alkylester.

20. A method according to claim 17, wherein the composition of said intermediate layer is selected such that a weight ratio of weight A of ethylene unsaturated compound constituting water dispersion vinyl polymerization emulsion and weight B of the partial saponification poly acetate vinyl utilized as the protecting colloid agent when said emulsion is polymerized falls in a ratio of A:B in a range of 99:1 to 10:90.

21. A method according to claim 17, wherein the composition of said intermediate layer is selected such that a weight ratio of weight A of ethylene unsaturated compound constituting water dispersion vinyl polymerization emulsion, weight B of partial saponification polyvinyl acetate constituting water dispersion vinyl polymerization emulsion utilized as the protecting colloid agent when said emulsion is polymerized, and weight C of partial saponification polyvinylacetate other than that constituting the water dispersion vinyl polymerization falls in a ratio of (A):(B+C) in a range of 99:1 to 10:90.

* * * * *